United States Patent [19]

Tamagawa

[11] Patent Number: 5,061,862

[45] Date of Patent: Oct. 29, 1991

[54] REFERENCE VOLTAGE GENERATING CIRCUIT

[75] Inventor: Akio Tamagawa, Tokyo, Japan

[73] Assignee: NEC Corporation, Tokyo, Japan

[21] Appl. No.: 550,659

[22] Filed: Jul. 10, 1990

[30] Foreign Application Priority Data

Jul. 11, 1989 [JP] Japan .................................. 1-179260

[51] Int. Cl.[5] ......................... H03K 3/01; G06G 7/12; G05F 3/04; G05F 3/16

[52] U.S. Cl. .............................. 307/296.1; 307/296.5; 307/296.6; 307/491; 307/496; 323/312; 323/316

[58] Field of Search ............... 307/296.1, 296.6, 296.5, 307/491, 494, 496; 323/312, 316

[56] References Cited

U.S. PATENT DOCUMENTS 4,507,572 3/1985 Hashimoto et al. ............. 307/296.1
4,931,718 6/1990 Zitta ................................ 307/296.1

OTHER PUBLICATIONS

Widlar, Robert J., "New Developments in IC Voltage Regulators", Feb. 1971, *IEEE Journal of Solid State Circuits,* vol. SC-6, No. 1.

Kuijk, Karel E., "A Precision Reference Voltage Source" Jun. 1973, *IEEE Journal of Solid State Circuits,* vol. SC-8, No. 3.

*Primary Examiner*—John S. Heyman
*Assistant Examiner*—Trong Phan
*Attorney, Agent, or Firm*—Helfgott & Karas

[57] ABSTRACT

A reference voltage generating circuit of the invention includes a differential amplifier having a pair of transistors of one conductivity type as differential input transistors; an operational amplifier having a pair of transistors of a conductivity type opposite to the one conductivity type as differential input transistors; and a feedback circuit constituted by a plurality of resistors, a first plurality of diodes connected in series and a second plurality of diodes connected in series. By the appropriate selection of the resistance value of each of the resistors, the temperature coefficient of the ouptut voltage can be made zero. The circuit of the invention does not require a start-up resistor which requires a considerably large chip area. The resultant reference voltage with respect to the ground potential or power supply potential outputted from the operational amplifier has no dependency on the variations or changes in the power supply voltage or in temperature.

8 Claims, 5 Drawing Sheets

REFERENCE VOLTAGE GENERATING CIRCUIT

BACKGROUND OF THE INVENTION

The present invention relates to a reference voltage generating circuit and, more particularly, to a bandgap reference voltage generating circuit using an operational amplifier.

As already known, a bandgap voltage generating circuit is used as a reference power source of, for example, a three-terminal IC regulator made up of bipolar transistors (R. J. Widlar, "New Developments in IC Voltage Regulators", IEEE Journal of Solid-State Circuits, Vol. SC-6, pp. 2-7, (1971)). The bandgap reference voltage generating circuit is indispensable to an electronic circuit which requires a reference voltage of a high stability and precision against any variations or changes such as in power supply voltage or in temperature. With the recent advancement in analog MOS techniques, the bandgap reference voltage generating circuit is now used also in MOS integrated circuits such as for analog-to-digital converters. Since a bipolar transistor having good properties can hardly be obtained by a process ordinarily employed for the manufacture of CMOS integrated circuits, the circuit generally used is one as shown in FIG. 5 (K. E. Kujik, "A Precision Reference Voltage Source", IEEE Journal of Solid-State Circuits, Vol. SC-8, pp. 222-226, (1973)). This circuit configuration does not require bipolar transistors and comprises diodes, resistors and an operational amplifier, so that a bandgap reference voltage generating circuit can easily be formed by a process for the manufacture of CMOS semiconductor integrated circuits.

However, the above conventional circuit requires a start-up resistor having a large resistance value and this results in an increase in a chip size. Also, the increase in the power supply voltage causes an increase in the current flowing in the start-up resistor, so that the output voltage necessarily has a dependency on the power supply voltage.

SUMMARY OF THE INVENTION

It is, therefore, an object of the invention to overcome the problems existing in the conventional arrangement and to provide an improved reference voltage generating circuit.

It is another object of the invention to provide a reference voltage generating circuit which can produce an output voltage of a high stability and a high precision.

It is a further object of the invention to provide a reference voltage generating circuit whose output voltage has no dependency on the variations in the power supply voltage or in temperature.

In carrying out the above and other objects of the invention in one form, there is provided an improved reference voltage generating circuit which comprises:

a first, a second and a third resistor;

a first plurality of n-diodes connected in series;

a second plurality of n-diodes connected in series;

a differential amplifier having a pair of transistors of one conductivity type as differential input transistors; and an operational amplifier having a pair of transistors of a conductivity type opposite to the one conductivity type as differential input transistors;

the first resistor having its one terminal connected to the output terminal of the operational amplifier and its other terminal grounded through the first plurality of n-diodes connected in series;

the second resistor having its one terminal connected to the output terminal of the operational amplifier and its other terminal connected to one terminal of the third resistor;

the third resistor having its other terminal grounded through the second plurality of n-diodes connected in series;

the differential amplifier having its first input terminal connected to a junction between the first resistor and the first plurality of n-diodes connected in series while its second input terminal connected to a junction between the second resistor and the third resistor; and the differential amplifier having its first output terminal connected to an inverting input terminal of the operational amplifier while its second output terminal connected to a non-inverting input terminal of the operational amplifier;

whereby the reference voltage generating circuit being capable of generating at the reference voltage output terminal of the operational amplifier a reference voltage with respect to the ground potential terminal or with respect to the power supply potential terminal.

BRIEF DESCRIPTION OF THE DRAWINGS

The above and other objects, features and advantages of the present invention will be apparent from the following description of preferred embodiments according to the invention explained with reference to the accompanying drawings, in which.

PREFERRED EMBODIMENTS OF THE INVENTION

Throughout the following explanation, similar reference symbols or numerals refer to the same or similar elements in all the figures of the drawings.

Figure 5:
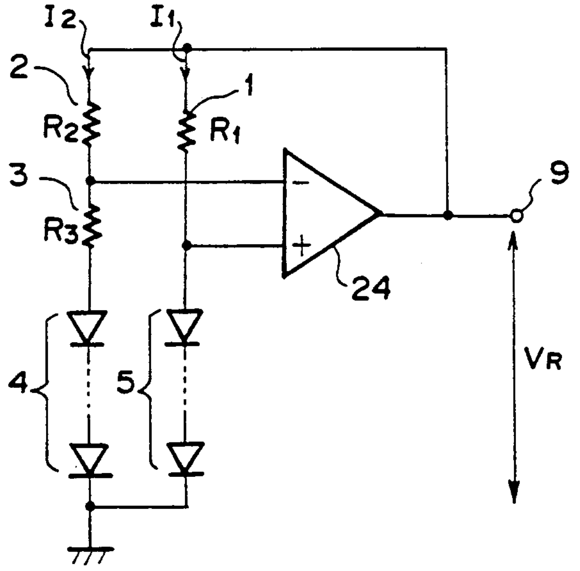
FIG. 5 PRIOR ART
FIG. 5 is a diagram showing a principle of a bandgap reference voltage generating circuit.

For the purpose of assisting in the understanding of the present invention, a conventional bandgap reference voltage generating circuit and problems existing therein will first be described by making reference to FIGS. 5 through 7 before the present invention is explained.

The operation of the conventional circuit referred to above is now explained with reference to a circuit diagram of FIG. 5. Since the potential difference between the differential input terminals of the operational amplifier 24 is 0 [V], the ratio of the currents flowing in the respective sets of first and second n-diodes 4, 5, each connected in series, may be given by:

$$\frac{I_2}{I_1} = \frac{R_2}{R_1}$$

Assuming that the forward voltage of one diode of respective sets of the first and second n-diodes connected in series is $V_F$, the forward voltage difference of each set of the first and second serially connected n-diodes may be expressed by:

$$n\Delta V_F = nV_T \ln\left(\frac{I_1}{I_2}\right) = nV_T \ln\left(\frac{R_2}{R_1}\right)$$

wherein $$V_T = \frac{kT}{q},$$

k is the Boltzmann constant, T is an absolute temperature and q is an elementary charge.

The potential difference $n\Delta V_F$ appears across the third resistor $R_3$ and, therefore, is given by the following equation:

$$n\Delta V_F = I_2 R_3 = \frac{I_1 R_1}{R_2} \cdot R_3$$

The output voltage $V_R$ is the sum of the voltage drop across the first n-diodes connected in series and the voltage drop across the first resistor $R_1$ and, therefore, is given by the following equation:

$$\begin{aligned} V_R &= nV_F + I_1 R_1 \\ &= nV_F + n\Delta V_F \frac{R_2}{R_3} \\ &= n\left[V_F + V_T \frac{R_2}{R_3} \ln\left(\frac{R_2}{R_1}\right)\right] = nV_{BG} \end{aligned}$$

wherein the temperature coefficient of $V_F$ is $-2$ mV/°C. and the temperature coefficient of $V_T$ is 0.085 mV/°C. Thus, by the appropriate selection of the resistance value of each of the resistors $R_1$, $R_2$ and $R_3$, the temperature coefficient of the output voltage $V_R$ can be made zero and, the output voltage under this state is n times the bandgap voltage $V_{BG}$.

Figure 6:
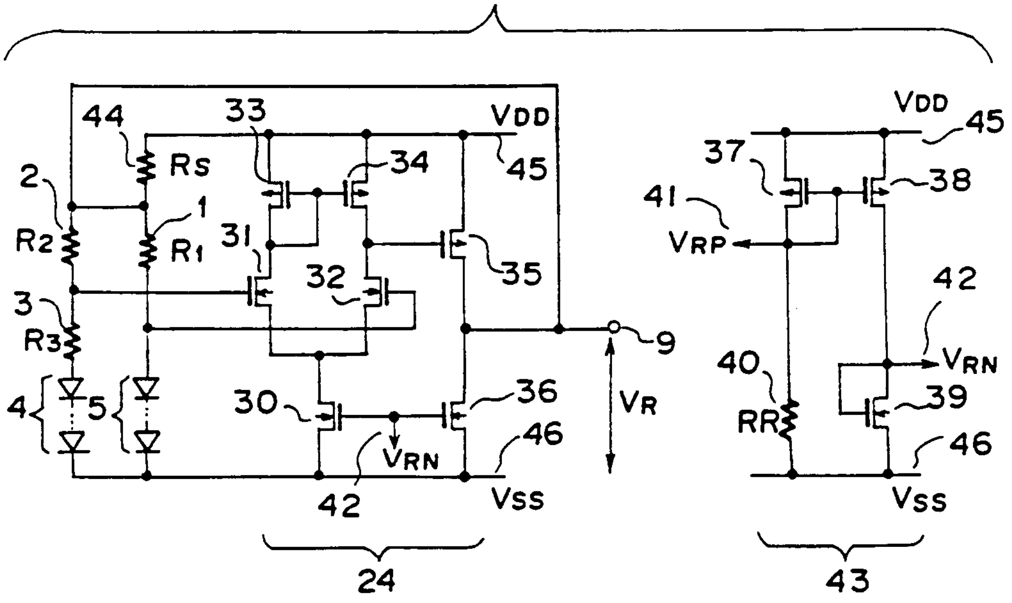
FIG. 6 PRIOR ART
FIG. 6 is a diagram showing a conventional bandgap reference voltage generating circuit.
Figure 7:
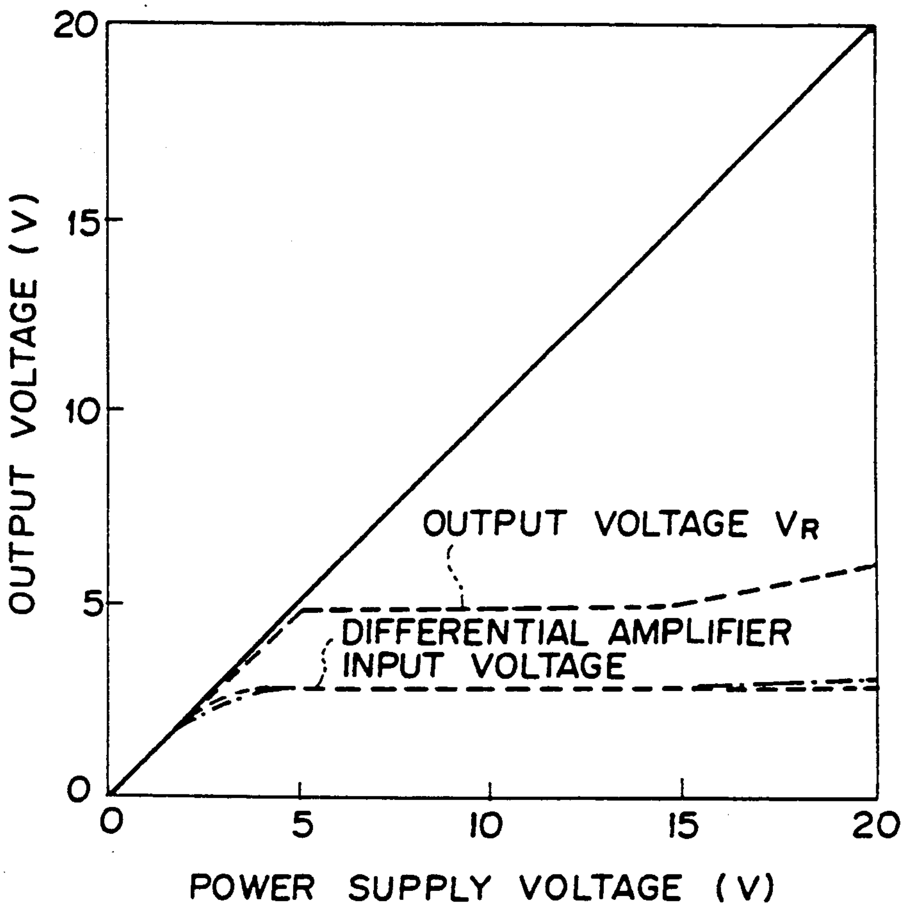
FIG.7 PRIOR ART
FIG. 7 is a graph showing the relation of characteristics of the output voltages against the power supply voltages in the conventional reference voltage generating circuit.

FIG. 6 shows a circuit diagram of a specific example of a conventional bandgap reference voltage generating circuit.

A current reference circuit 43 supplies a gate biasing voltage to N-channel transistors 30, 36 constituting a constant current source in an operational amplifier 24.

The operational amplifier 24 comprises a pair of differential input transistors 31, 32 which are of N-channel transistors. The reason for this is that the gate voltage of the paired differential input transistors is not dependent on the power supply voltage and is substantially fixed to $nV_F$, so that the extent in which the characteristics such as gains obtained by the operational amplifier 24 depend on the power supply voltage can be limited to minimal.

The conventional bandgap reference voltage generating circuit described above has two operating points. The first operating point is a point at the time when the output voltage $V_R = nV_{BG}$ as shown above and, the second operating point is a point at the time when the same output voltage $V_R = 0$ [V].

How the above operating points come about is hereinafter explained.

When the output voltage $V_R$ is 0 [V], the potential of the input terminals of the operational amplifier 24 is 0 [V]. Therefore, the paired differential input transistors 31, 32 turn OFF and the gate voltage of the transistor 35 of the output stage increases to the level of the power supply voltage, so that the transistor 35 of the output stage turns OFF. As a result, the output level of the operational amplifier 24 changes to 0 [V] and the output voltage $V_R$ stays at 0 [V]. Normally, in order to have the first operating point changed to the second operating point, there is provided a start-up resistor Rs(44) connected between a power supply terminal 45 and a reference voltage output terminal 9. It is necessary that the resistance value of such start-up resistor Rs(44) be sufficiently larger as compared to that of the first, second or third resistor, which results in an increase in a chip size. Also, the increase in the power supply voltage caused an increase in the current flowing in the start-up resistor Rs(44) so that the output voltage $V_R$ unavoidably had a dependency on the power supply voltage as shown in FIG. 7 graph. The number n of diodes connected in series is 4.

The current reference circuit 43 of the prior art circuit of FIG. 6 stabilizes the circuit when the differential input voltage of the operational amplifier 24 is 0 [V], that is, at the point where the gate potentials of the transistors 31 and 32 become identical to each other.

Under the above state, the output voltage $V_R$ of the operational amplifier 24 may be rendered to $V_R = nV_{BG}$ by having the resistance values of the resistors $R_1$, $R_2$, $R_3$ set to the ratio as given above.

According to the present invention, the reference voltage generating circuit comprises a first, a second and a third resistor, a first plurality of n-diodes connected in series, a second plurality of n-diodes connected in series, a differential amplifier having N-channel transistors as differential input paired transistors and, an operational amplifier having P-channel transistors as differential input paired transistors.

Unlike with the conventional bandgap reference voltage generating circuit as described above, the circuit according to the present invention does not require a start-up resistor and is capable of performing a self start-up. The elimination of the start-up resistor results in the reduction of the necessary chip area and the output voltage is constant and stable without dependence on the power supply voltage, that is, without being influenced by any variation in the power supply voltage.

Next, the details of the present invention are explained with reference to the appended drawings.

Figure 1:
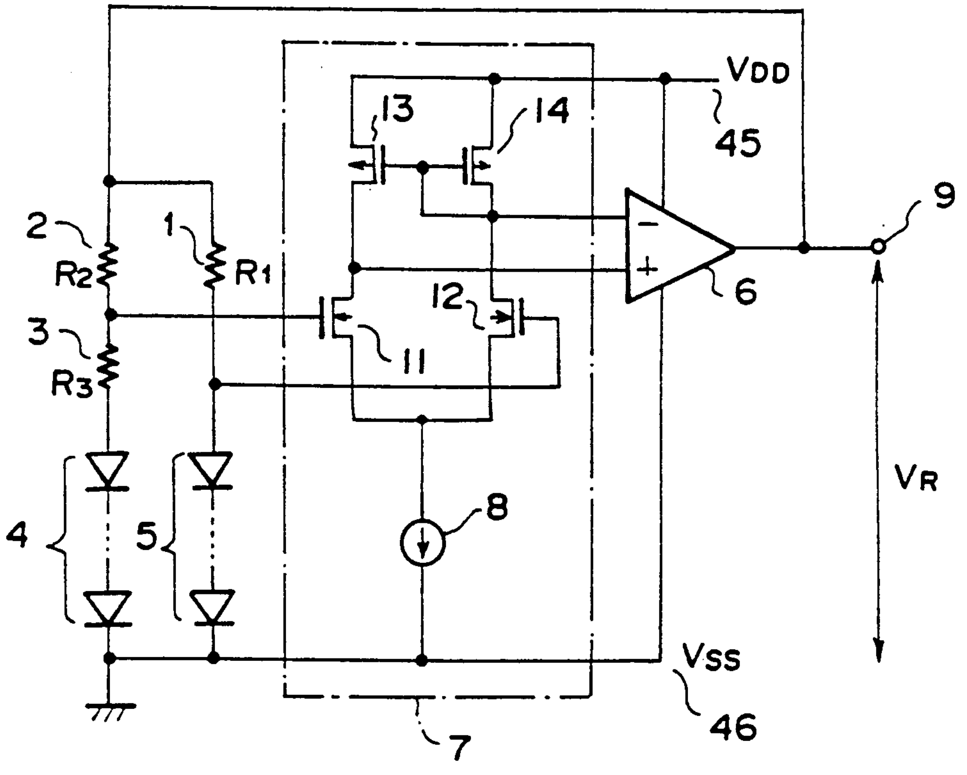
FIG. 1 is a circuit diagram showing a reference voltage generating circuit as a first embodiment according to the present invention.
Figure 2:
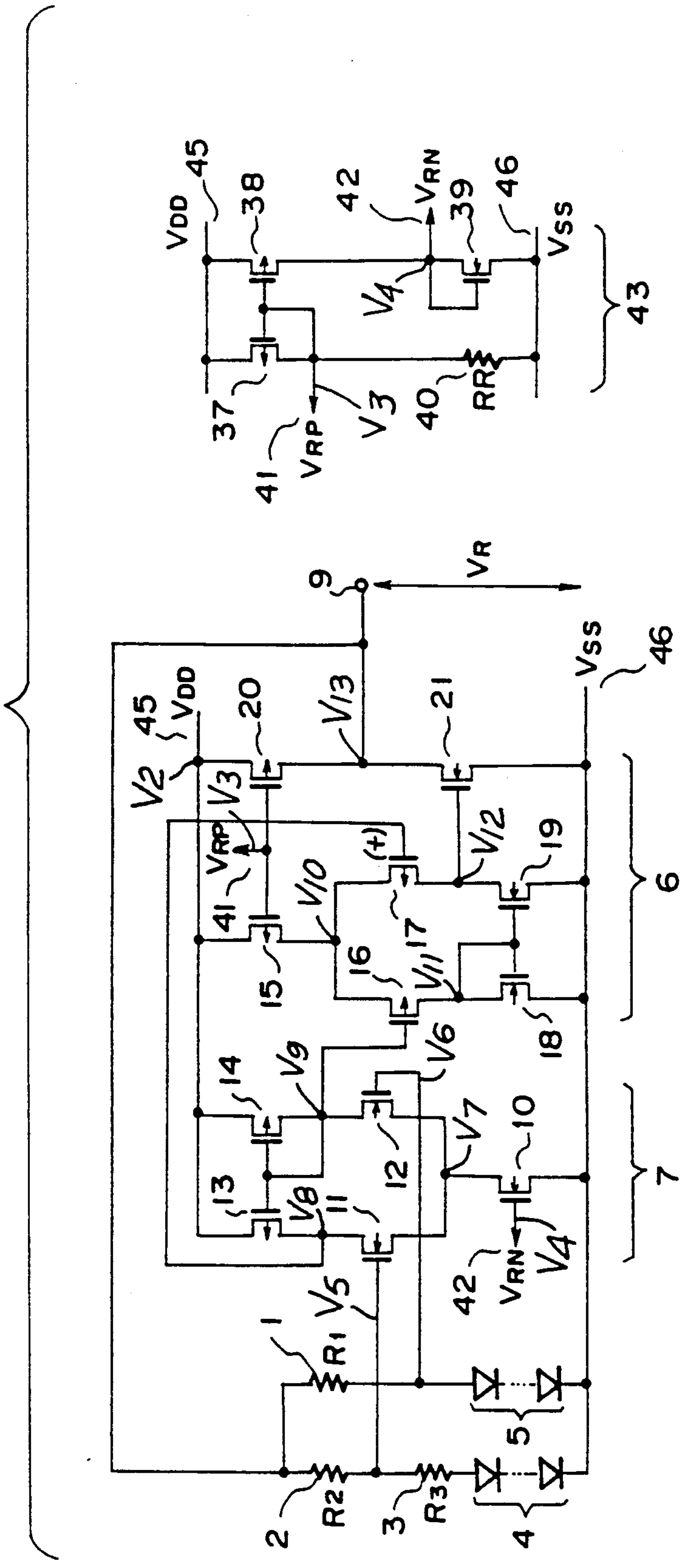
FIG. 2 is a detailed circuit diagram showing the circuit of FIG. 1.

FIG. 1 shows a circuit diagram of a first embodiment of the present invention. In the bandgap reference voltage generating circuit as compared with the conventional circuit explained above, the start-up resistor existed in the latter is eliminated and the operational amplifier portion in the latter is replaced by a differential amplifier 7 including N-channel MOS transistors 11, 12 as differential input paired transistors and an operational amplifier 6 including P-channel MOS transistors 16, 17 as differential input paired transistors. FIG. 2 is a more detailed circuit diagram of FIG. 1 circuit. The bias circuit 43 of the conventional bandgap reference voltage generating circuit of FIG. 6 is also incorporated in the circuit of the invention shown in FIG. 2. The node 41 between the gates of MOSFETS 15 and 20 is a terminal to be connected to the terminal 41 of the bias circuit 43. The gate of transistor 20 is connected to the circuit 43 through the terminal $V_{RP}$(41) and a constant voltage is applied to this gate. The transistor 20 is a constant current source when the transistor is under the saturation state. The start-up operation of this circuit is now explained with reference to FIG. 2. When the output voltage $V_R$ is 0 [V], the gate potentials of the N-channel transistors 11, 12 are 0 [V] and therefore the N-channel transistors 11, 12 turn OFF. Then, the gate potentials of the P-channel transistors 16, 17 increase to the level of the power supply voltage, so that the P-channel transistors 16, 17 turn OFF. As a result, the gate potential of the transistor 21 at the output stage of the operational amplifier 6 changes to 0 [V] and this transistor 21 turns OFF whereby the output voltage $V_R$ rises and stays constant at the first operating point. In this circuit, since the first, second and third resistors $R_1$, $R_2$, $R_3$ and the first and second n-diodes 5, 4 respectively connected in series, which constitute a feedback circuit, are driven by a constant current source transistor 20 of the operational amplifier 6, it is necessary that the dimension of this transistor 20 be sufficiently large.

Figure 3:
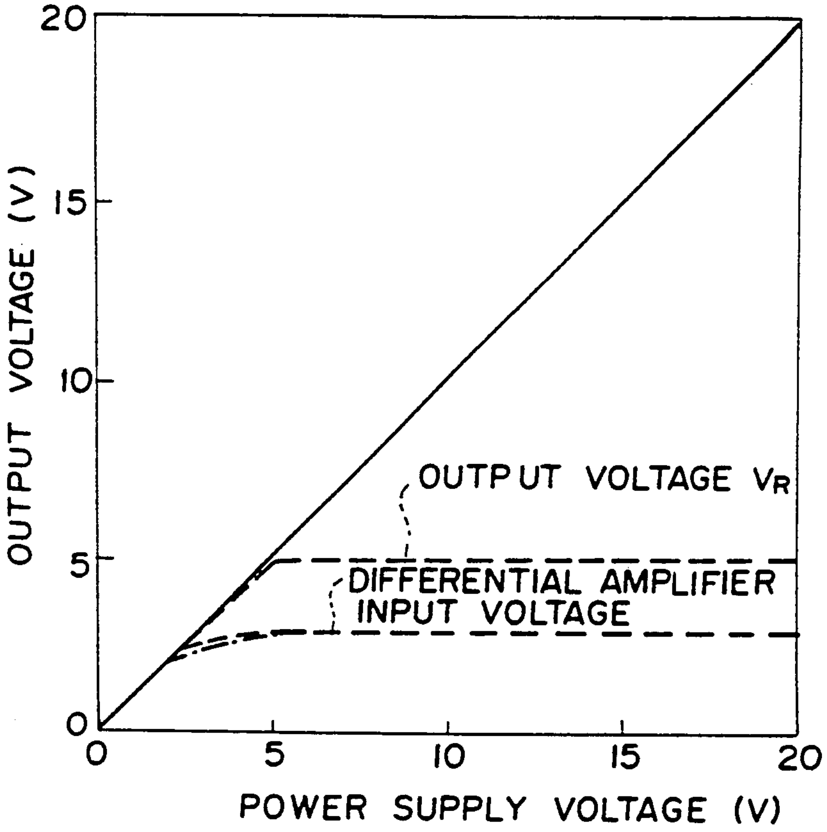
FIG. 3 is a graph showing the relation of characteristics of the output voltages against the power supply voltages in the circuit of the first embodiment.

FIG. 3 is a graph showing the characteristics of the output voltage against the power supply voltage in the bandgap reference voltage generating circuit according to the present invention, in the case where the number n of the diodes connected in series is 4. In the conventional circuit described above, the output voltage $V_R$ shows an increase as the power supply voltage increases from a point of 15 [V] of the power supply voltage as shown in FIG. 7 and this is due to the existence of the start-up resistor. In the circuit according to the present invention, the output voltage is constant and stable even above 20 [V] of the power supply voltage. Theoretically, the output voltage can be constant even up to the breakdown voltage of the element concerned. The elimination of the start-up resistor is significant as it requires a considerably large chip area. As compared with the conventional arrangement, the number of the necessary transistors in the circuit according to the present invention increases by the number of transistors which constitute the differential amplifier 7, but the overall chip area of the circuit is smaller than that of the conventional one.

When the voltage of the output terminal 9 is 0 [V], the gate voltage of the transistors 11, 12 turn OFF. Thus, almost all of the power supply voltage is applied to transistors 11, 12 and the gate voltage of the transistors 16, 17 becomes the $V_{DD}$ potential.

When the gate potential of the P-channel transistors 16, 17 becomes the $V_{DD}$, the P-channel transistors 16, 17 turn OFF and the gate of the N-channel transistor 21 becomes 0 [V] and the N-channel transistor 21 turns OFF accordingly. Thus, the output voltage $V_R$ of the output terminal 9 becomes the $V_{DD}$ potential.

Next, when the voltage of the output terminal 9 becomes $V_{DD}$, the gate voltage of each of the N-channel transistors 11, 12 is raised from the GND potential by $nV_F$ through the feedback circuit formed by the resistors $R_1$, $R_2$, $R_3$ and the serially-connected diodes 4, 5. Here n represents the number of diodes, and $V_F$ is a forward voltage of the diodes ($V_F \approx 0.7$ [V]). When $n=4$, resulting in $nV_F=4\times0.7=2.8$ [V], the N-channel transistors 11, 12 turn ON. ($V_T$ of N-channel transistor is approximately 1 [V].)

The current mirror circuit formed by the P-channel transistors 13, 14 outputs $V_{DD}$ only during the period in which the N-channel transistors 11, 12 are in their OFF state. When the N-channel transistors 11, 12 turn ON, the differential amplifier 7 constituted by the N-channel transistors 10, 11, 12 and the P-channel transistors 13, 14 can carry out its normal operation so that the output voltage changes according to the differential input voltage.

When the gate voltages of the N-channel transistors 11, 12 are identical to each other, the constant current which flows in the N-channel transistor 10 constituting the constant current source is evenly divided and the voltages of the drains of the P-channel transistors 13, 14 will become of the same value. Such voltages are determined by the ratio between the current driving capability (transistor size) of the N-channel transistor 10 and that of the P-channel transistors 13, 14, so that, when the current driving capabilities are arranged to be the same, the voltage will be approximately $V_{DD}/2$.

Therefore, as long as the N-channel transistors 11, 12 are in their ON state, the current mirror circuit (13, 14) never outputs the power supply voltage $V_{DD}$.

Where the output of the current mirror circuit formed by the transistors 13, 14 is in the order of $V_{DD}/2$, the input paired transistors 16, 17 of the operational amplifier 6 turn ON and the output of the operational amplifier 6 changes in accordance with the differential input voltage.

In the circuit shown in FIG. 2, feedback loops are formed. This circuit is stabilized at the point when the differential input voltage of the differential amplifier formed by the N-channel transistors 11, 12 becomes 0 [V], that is, when the gate voltages of the N-channel transistors 11, 12 become of the same value. In this state, the output voltage $V_R$ of the operational amplifier 6 becomes $V_R=nV_{BG}$ if the ratio of the resistors $R_1$, $R_2$ and $R_3$ is set, as described above.

It is now assumed that the voltage is stabilized at the output voltage $V_R=nV_{BG}$. The fact that the output voltage $V_R$ of the operational amplifier 6 is $nV_{BG}$ which is an intermediate potential between the $V_{DD}$ and GND potentials means that the differential input voltage of the operational amplifier 6 is substantially 0 [V]. The reason is that, since the voltage gain by the operational amplifier is high and is in the order of 60–100 dB (1,000–100,000 times), the differential input voltage must be 0 [V] for the output voltage to be finite (that is, it must be in a "virtual earth" state).

When the differential input voltage of the operational amplifier 6 is 0 [V] the differential amplifier 7 is balanced and the voltages inputted to the N-channel transistors 11, 12 are the same.

Now, the operation under the situation in which the output voltage $V_R$ is deviated toward the $V_{DD}$ side will be explained.

It is assumed that the output voltage $V_R=nV_{BG}$ is deviated toward the side of $V_{DD}$. This voltage is feedback to the differential amplifier 7 through the feedback circuit formed by the resistors $R_1$, $R_2$, $R_3$ and the diodes 4, 5. Since the gate of the N-channel transistor 12 is connected to the junction of the resistor $R_1$ and the diodes 5, it is fixed substantially constant ($nV_F$) even when $V_R$ deviates to the side of $V_{DD}$.

However, since the gate of the N-channel transistor 11 is connected to the junction of the resistor $R_2$ and the resistor $R_3$, it is greatly influenced by the $V_R$ being deviated to the side of $V_{DD}$ and changes towards the side of $V_{DD}$.

Consequently, the differential amplifier 7 loses its balance. The gate voltage of the N-channel transistor 11 becomes higher than that of the N-channel transistor 12 so that the ON resistance of the N-channel transistor 11 is lowered thereby causing the drain voltage of the P-channel transistor 13 to be dropped.

Since the voltage of the gate of the P-channel transistor 17 which is the (+) input terminal of the operational amplifier 6 becomes lower than the (−) input terminal with the same result as the negative voltage being inputted as the differential input voltage, the output voltage of the operational amplifier 6 decreases towards the GND potential and is stabilized as $V_R=nV_{BG}$.

Next, the situation wherein the output $V_R$ is deviated toward the side of the GND potential will be considered.

It is now assumed that the output voltage $V_R=nV_{BG}$ deviates toward the side of GND. This voltage is fed-back to the differential amplifier 7 through the feedback circuit formed by the resistors $R_1$, $R_2$, $R_3$ and the diodes 4, 5. Since the gate of the N-channel transistor 11 is connected to the junction between the resistor $R_2$ and the resistor $R_3$, the input voltage to the gate of the N-channel transistor 11 changes towards the side of GND as being greatly influenced by changes in the output voltage $V_R$ of the operational amplifier 6.

Consequently, the differential amplifier 7 loses its balance. The gate voltage of the N-channel transistor 11 becomes lower than that of the N-channel transistor 12 so that the ON resistance of the N-channel transistor 11 becomes higher than that of the N-channel transistor 12 thereby causing the drain voltage of the P-channel transistor 13 to be raised.

Since the gate voltage of the P-channel transistor 17 which is the (+) input terminal of the operational amplifier 6 becomes higher than the (−) input terminal with the same result as the positive voltage being inputted as the differential input voltage, the output voltage of the operational amplifier 6 increases towards the $V_{DD}$ side and is stabilized at $V_R=nV_{BG}$.

Therefore, where the power supply voltage $V_{DD}$ is at least $V_R=nV_{BG}$, the circuit according to the present invention can produce a constant output $V_R=nV_{BG}$ having characteristics as shown in FIG. 3. ($V_{BG}=1.2$ [V] when n=4, which results in $V_R=4\times1.2$–4.8 [V]).

The main advantage of the present invention resides in that the output voltage $V_R=nV_{BG}$ can be obtained without a start-up resistor.

Table 1 shows, as an example, potentials at the respective nodes $V_1$ through $V_{13}$ in the circuit of the invention shown in FIG. 2, under the state in which the power supply voltage $V_{DD}$ is 10.0 [V]. The output points of the current mirror circuit constituted by the P-channel transistors 13, 14 correspond to the nodes $V_8$ and $V_9$. It should be noted that the potentials at the nodes $V_8$ and $V_9$ are not the $V_{DD}$ potentials but the potentials lower than $V_{DD}$ by 3 [V].

TABLE 1

| NODES | POTENTIALS | NODES | POTENTIALS |
|---|---|---|---|
| $V_2$ | 10.000 V | $V_8$ | 6.963 V |
| $V_3$ | 5.965 V | $V_9$ | 6.969 V |
| $V_4$ | 3.258 V | $V_{10}$ | 9.590 V |
| $V_5$ | 2.390 V | $V_{11}$ | 2.043 V |
| $V_6$ | 2.390 V | $V_{12}$ | 3.020 V |

TABLE 1-continued

| NODES | POTENTIALS | NODES | POTENTIALS |
|---|---|---|---|
| $V_7$ | 0.524 V | $V_{13}$ | 4.784 V |

When no start-up resistor Rs is required as is the case of the present invention, and when it is assumed that the output voltage $V_R$ is 0 [V], the operation is as follows:

By the feedback circuits formed by the resistors $R_1$, $R_2$, $R_3$ and the diodes 4, 5, the voltage 0 [V] is inputted to the gates of the input paired transistors 31, 32 of the operational amplifier 24 and the N-channel transistors 31, 32 turn OFF. The power supply voltage is mostly applied to the transistors 31, 32 and the potentials of the drains of the transistors 33, 34 constituting the current mirror circuit becomes the $V_{DD}$ potential.

Since the voltage $V_{DD}$ is inputted to the gate of the P-channel 35, this transistor turns OFF and the output voltage $V_R$ stabilizes at 0 [V]. This means that the voltage $V_R=nV_{BG}$ aimed at is not obtained.

In the conventional circuit provided with start-up resistor RS, when it is assumed that the voltage $V_R$ is 0 [V], the operation is as follows:

The power supply voltage $V_{DD}$ is applied directly to the start up resistor Rs and the current flows to the feedback circuits formed by the resistors $R_1$, $R_2$, $R_3$ and the diodes 4, 5. As a result, the gate voltage of each of the transistors 31, 32 rises to $NV_F$ and the transistors 31, 32 turn ON. Then the operational amplifier 24 starts operating as normal and, after amplifying the differential input voltage, outputs the voltage thus amplified. The circuit including the Rs resistor requires a much larger chip area than the circuit of FIG. 2.

Figure 4:
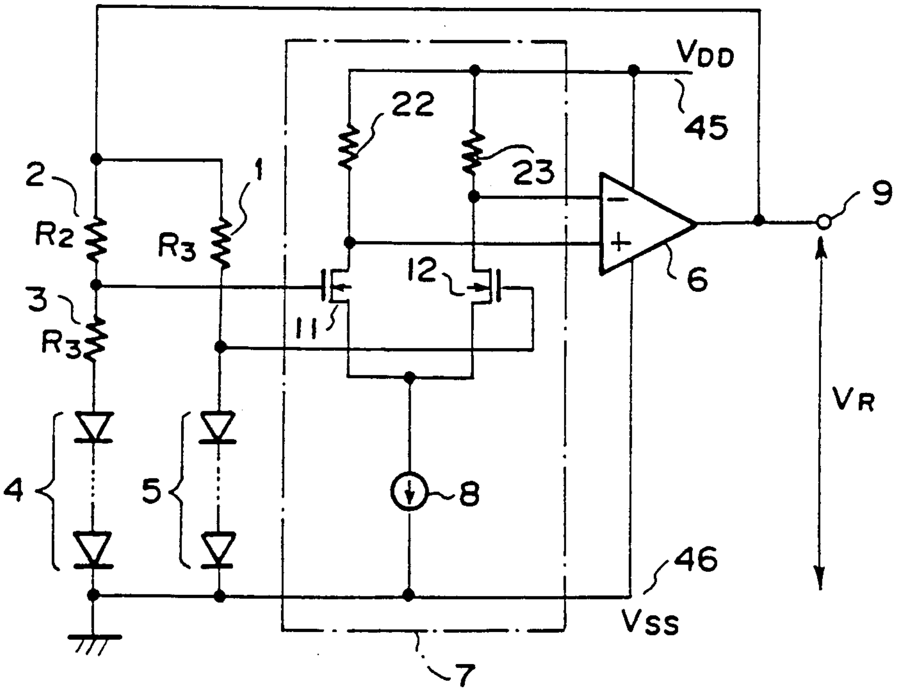
FIG. 4 is a circuit diagram showing a reference voltage generating circuit as another embodiment according to the present invention.

FIG. 4 is a circuit diagram of another embodiment according to the present invention. In this circuit, the load portion of the differential amplifier 7 is changed from its active loads to merely a pair of resistors 22, 23. By this change, the gain of the differential amplifier 7 becomes smaller whereby the phase compensation circuitry for the overall circuit can be simplified and any such trouble as oscillation can be prevented.

The foregoing explanation has been made for the circuit in which the reference voltage with respect to the ground potential terminal is generated but the same explanation applies to the circuit wherein the reference voltage with respect to the power supply potential terminal is generated with the polarities of the power supply terminal and the ground terminal exchanged with each other and further with the N-channel transistors 11, 12 in the differential amplifier 7 replaced by the P-channel transistors and the P-channel transistors 16, 17 in the operational amplifier 6 by the N-channel transistors, respectively.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A reference voltage generating circuit comprising:

a first, a second and a third resistor;

a first plurality of n-diodes connected in series;

a second plurality of n-diodes connected in series;

a differential amplifier having a pair of transistors of one conductivity type as differential input transistors; and an operational amplifier for amplifying a differential input voltage and outputting an amplified voltage to an output terminal, said operational amplifier having a pair of transistors of a conductivity type opposite to that of said one conductivity type as differential input transistors, and a one-stage inverting amplifier;

said first resistor having its one terminal connected to the output terminal of said operational amplifier and its other terminal grounded through said first plurality of n-diodes connected in series;

said second resistor having its one terminal connected to the output terminal of said operational amplifier and its other terminal connected to one terminal of said third resistor;

said third resistor having its other terminal grounded through said second plurality of n-diodes connected in series;

said differential amplifier having its first input terminal connected to a junction between said first resistor and said first plurality of n-diodes connected in series and its second input terminal connected to a junction between said second resistor and said third resistor; and said differential amplifier having its first output terminal connected to an inverting input terminal of said operational amplifier and its second output terminal connected to a non-inverting input terminal of said operational amplifier;

whereby said reference voltage generating circuit is capable of generating at said output terminal of said operational amplifier a reference voltage with respect to the ground potential terminal.

2. A reference voltage generating circuit according to claim 1, in which said paired transistors of one conductivity type being of N-channel MOS field effect transistors and said paired transistors of the other conductivity type being of P-channel MOS field effect transistors.

3. A reference voltage generating circuit according to claim 1, in which said differential amplifier having active loads as its load portion.

4. A reference voltage generating circuit according to claim 1, in which said differential amplifier having resistors as its load portion.

5. A reference voltage generating circuit comprising:

a first, a second and a third resistor;

a first plurality of n-diodes connected in series;

a second plurality of n-diodes connected in series;

a differential amplifier having a pair of transistors of one conductivity type as differential input transistors; and an operational amplifier for amplifying a differential input voltage and outputting the amplified voltage to an output terminal, said operational amplifier having a pair of transistors of a conductivity type opposite to said one conductivity type as differential input transistors, and a one-stage inverting amplifier;

said first resistor having its one terminal connected to the output terminal of said operational amplifier and its other terminal connected to a power supply potential terminal through said first plurality of n-diodes connected in series;

said second resistor having its one terminal connected to the output terminal of said operational amplifier and its other terminal connected to one terminal of said third resistor;

said third resistor having its other terminal connected to the power supply potential terminal through said second plurality of n-diodes connected in series;

said differential amplifier having its first input terminal connected to a junction between said first resistor and said first plurality of n-diodes connected in series and its second input terminal connected to a junction between said second resistor and said third resistor; and said differential amplifier having its first output terminal connected to an inverting input terminal of said operational amplifier and its second output terminal connected to a non-inverting input terminal of said operational amplifier;

whereby said reference voltage generating circuit is capable of generating at said output terminal of said operational amplifier a reference voltage with respect to the power supply potential terminal.

6. A reference voltage generating circuit according to claim 5, in which said paired transistors of one conductivity type being of P-channel MOS field effect transistors and said paired transistors of the other conductivity type being of N-channel MOS field effect transistors.

7. A reference voltage generating circuit according to claim 5, in which said differential amplifier has active loads as its load portion.

8. A reference voltage generating circuit according to claim 5, in which said differential amplifier has resistors as its load portion.

* * * * *